US010481207B2

(12) United States Patent
Sabate et al.

(10) Patent No.: US 10,481,207 B2
(45) Date of Patent: Nov. 19, 2019

(54) SWITCHING AMPLIFIER AND METHOD FOR ESTIMATING REMAINING LIFETIME OF A SWITCHING AMPLIFIER

(71) Applicant: General Electric Company, Schenectady, NY (US)

(72) Inventors: Juan Antonio Sabate, Gansevoort, NY (US); Louis Frigo, Brookfield, WI (US); Pengcheng Zhu, Shanghai (CN); Melissa Freeman, Oconomowoc, WI (US); Margaret Wiza, New Berlin, WI (US); Syedsaad Ali, Waukesha, WI (US); Fei Xu, Shanghai (CN); Xi Lu, Shanghai (CN); Tao Wu, Nanjing (CN); Ruxi Wang, Cohoes, NY (US)

(73) Assignee: General Electric Company, Schenectady, NY (US)

( * ) Notice: Subject to any disclaimer, the term of this patent is extended or adjusted under 35 U.S.C. 154(b) by 297 days.

(21) Appl. No.: 15/471,555

(22) Filed: Mar. 28, 2017

(65) Prior Publication Data

US 2017/0276730 A1 Sep. 28, 2017

(30) Foreign Application Priority Data

Mar. 28, 2016 (CN) .......................... 2016 1 0183549

(51) Int. Cl.
*G01R 31/327* (2006.01)
*G01K 7/42* (2006.01)
(Continued)

(52) U.S. Cl.
CPC ........... *G01R 31/3277* (2013.01); *G01K 7/42* (2013.01); *G01R 31/2633* (2013.01);
(Continued)

(58) Field of Classification Search
CPC ............ G01R 31/2632; G01R 31/2633; G01R 31/2635; G01R 31/26; G01R 31/2642;
(Continued)

(56) References Cited

U.S. PATENT DOCUMENTS 6,111,458 A * 8/2000 Ideler ................. G01R 33/3852
327/108
7,176,804 B2 2/2007 Norrena et al.
(Continued)

FOREIGN PATENT DOCUMENTS

CN 104091203 A 10/2014
DE 102010021171 A1 11/2011
DE 102011087764 A1 6/2013

OTHER PUBLICATIONS

Musallam et al., "Real-time life expectancy estimation in power modules", Electronics System-Integration Technology Conference, 2008. ESTC 2008. 2nd, pp. 231-236, Sep. 1-4, 2008.
(Continued)

*Primary Examiner* — Tung X Nguyen (57) ABSTRACT

A switching amplifier includes a power device and a processing device. The power device is configured for powering a load and is comprised of a plurality of switches. The processing device configured to calculate a switch junction temperature for a bonding wire in each switch based at least in part on a power loss of each switch; generate a first accumulated fatigue damage of the bonding wire in each switch based on the switch junction temperature; and generate an estimated remaining lifetime of the switching amplifier based on the first accumulated fatigue damages of the bonding wires in each switch.

12 Claims, 8 Drawing Sheets

(51) Int. Cl.
   *G01R 31/26* (2014.01)
   *H03F 1/52* (2006.01)
   *H03F 3/217* (2006.01)
   *G01R 31/44* (2006.01)
   *G01R 33/385* (2006.01)

(52) U.S. Cl.
   CPC .............. *G01R 31/44* (2013.01); *H03F 1/523* (2013.01); *H03F 3/2178* (2013.01); *G01K 2217/00* (2013.01); *G01R 33/3852* (2013.01)

(58) Field of Classification Search
   CPC ............ G01R 31/2648; G01R 31/2831; G01R 31/31702
   See application file for complete search history.

(56) References Cited

U.S. PATENT DOCUMENTS

| | | | |
|---|---|---|---|
| 2009/0096405 A1 | | 4/2009 | Flickinger et al. |
| 2013/0177041 A1* | | 7/2013 | Sundaramoorthy ........................ G01R 31/2619 374/178 |
| 2014/0196462 A1 | | 7/2014 | Nguyen et al. |
| 2014/0233708 A1 | | 8/2014 | Ishiyama et al. |

OTHER PUBLICATIONS

Musallam et al., "An Efficient Implementation of the Rainflow Counting Algorithm for Life Consumption Estimation", Reliability, IEEE Transactions on, vol. 61, Issue 4, pp. 978-986, Oct. 10, 2012.

Huifeng et al., "Real-Time Temperature Estimation for Power MOSFETs Considering Thermal Aging Effects", Device and Materials Reliability, IEEE Transactions on, vol. 14, Issue 1, pp. 220-228, Nov. 22, 2013.

Gopireddy et al., "Rainflow algorithm based lifetime estimation of power semiconductors in utility applications", Applied Power Electronics Conference and Exposition (APEC), 2014 Twenty-Ninth Annual IEEE, pp. 2293-2299, Mar. 16-20, 2014.

Musallam et al., "Mission Profile-Based Reliability Design and Real-Time Life Consumption Estimation in Power Electronics", Power Electronics, IEEE Transactions on, vol. 30, Issue 5, pp. 2601-2613, Sep. 17, 2014.

Ciappa et al., "Reliability odometer for real-time and in situ lifetime measurement of power devices", Microelectronics Reliability, vol. 55, Issues 9-10, pp. 1351-1356, Aug.-Sep. 2015.

Choi, "Effect of Junction Temperature Swing ($\Delta T_j$) Duration on Lifetime of IGBT Module", Center of Reliable Power Electronics, pp. 1-16.

* cited by examiner

SWITCHING AMPLIFIER AND METHOD FOR ESTIMATING REMAINING LIFETIME OF A SWITCHING AMPLIFIER

CROSS-REFERENCE TO RELATED APPLICATIONS

This application claims priority to China patent application number 201610183549.8, filed on Mar. 28, 2016, the entirety of which is incorporated herein by reference.

BACKGROUND

Embodiments of the disclosure relate generally to switching amplifiers, and more particularly to a switching amplifier and a method for estimating remaining lifetime of the switching amplifier.

A switching amplifier is typically configured for driving a load of magnetic resonance imaging (MRI) systems, a load of systems in renewable energy, a load of systems in aviation, or a load of systems in transportation, etc. The switching amplifier is a key component of the above systems.

Taking the switching amplifier as a gradient driver for example. If the gradient driver fails, imaging is impossible and the MRI is unusable until the gradient driver is either repaired or replaced. The gradient reliability estimates and the lifetime expectation are very important to manage the maintenance of MR systems to ensure minimum disruption on the use of the MRI system. Several generations of gradient drivers have shown that the components with the highest probability of failure in the gradient amplifier are the power devices.

The traditional way to get the remaining lifetime data is to do an accumulation test for the power devices, and the accumulation test is doing offline.

It is desirable to provide a real time detection and calculation method to estimate the lifetime consumption for the power devices in MRI gradient driver system.

SUMMARY

In accordance with one or more embodiments disclosed herein, a switching amplifier includes a power device and a processing device. The power device is configured for powering a load and is comprised of switches. The processing device configured to calculate a switch junction temperature for a bonding wire in each switch based at least in part on a power loss of the switch; generate a first accumulated fatigue damage of the bonding wire in each switch based on the switch junction temperature; and generate an estimated remaining lifetime of the switching amplifier based on the first accumulated fatigue damages of the bonding wires in the respective switches.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

In an effort to provide a concise description of these embodiments, not all features of an actual implementation are described in one or more specific embodiments. It should be appreciated that in the development of any such actual implementation, as in any engineering or design project, numerous implementation-specific decisions must be made to achieve the developers' specific goals, such as compliance with system-related and business-related constraints, which may vary from one implementation to another.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either any, several, or all of the listed items. The use of "including," "comprising," or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. The terms "circuit," "circuitry," and "controller" may include either a single component or a plurality of components, which are either active and/or passive components and may be optionally connected or otherwise coupled together to provide the described function.

Figure 1:
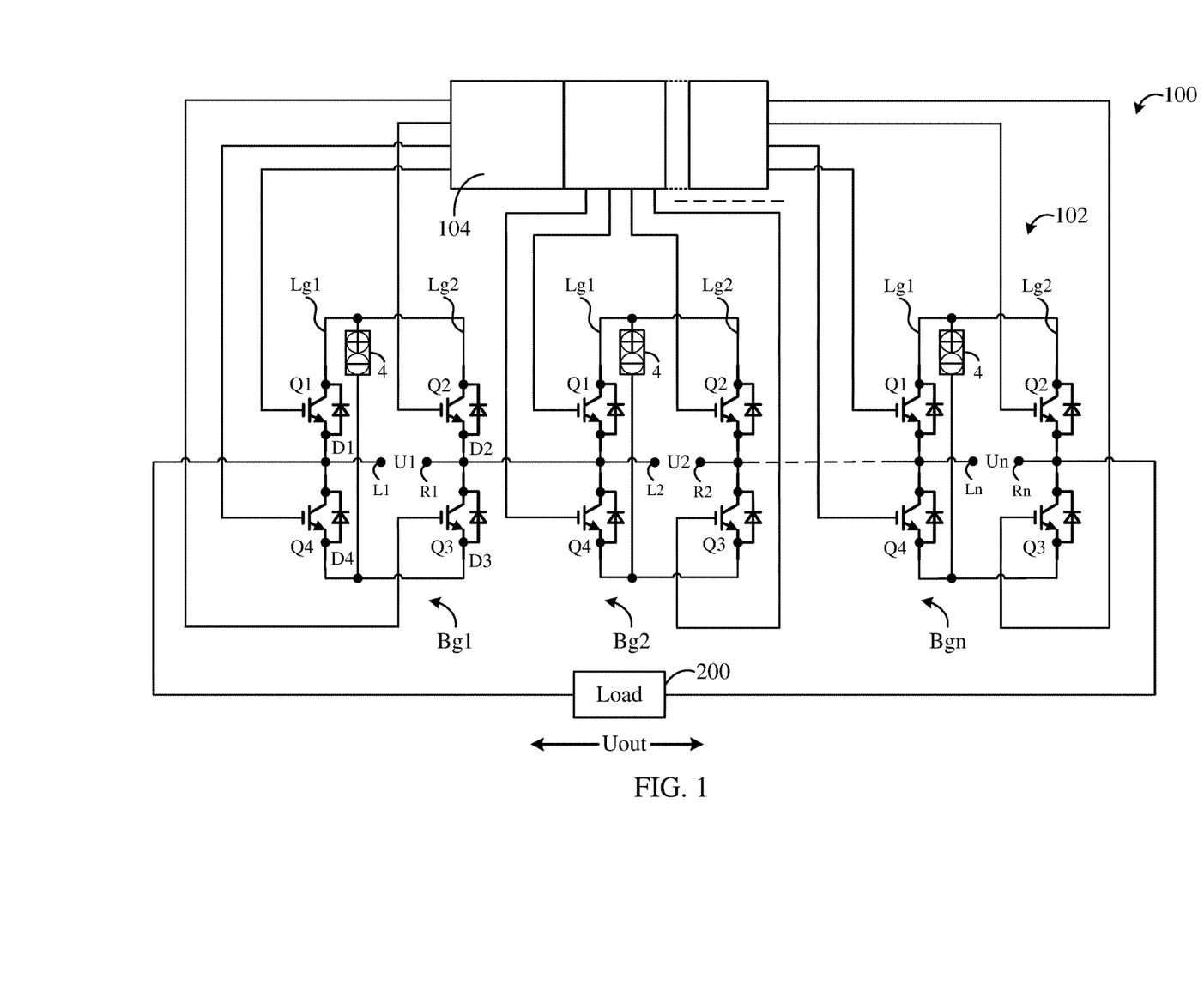
FIG. 1 is a circuit diagram of a switching amplifier in accordance with an exemplary embodiment.

FIG. 1 is a circuit diagram of a switching amplifier 100 in accordance with an exemplary embodiment. The switching amplifier 100 includes a power device 102 for powering a load 200 and a processing device 104 for controlling operations of the power device 102. In the embodiment, the switching amplifier 100 may be a gradient amplifier of a magnetic resonance imaging (MRI) system for example, the load 200 may be a gradient coil of the MRI system for example. In other embodiments, the switching amplifier 100 may be configured for driving the load in systems in renewable energy, the load of systems in aviation, or the load of systems in transportation, etc.

The power device 102 includes a plurality n of bridge circuits Bg1, Bg2, . . . Bgn coupled in series between two terminals of the load 200. Bridge circuit voltages U1, U2, . . . Un are allocated to the respective bridge circuits Bg1, Bg2, . . . Bgn, their sum yields an output voltage Uout, across the load 200, of the power device 102; thus Uout=U1+U2+ . . . Un.

In the embodiment, each of the bridge circuits Bg1, Bg2, . . . Bgn includes two leg circuits Lg1, Lg2 in known fashion, at which a power source 4 is connected. The leg circuit Lg1 includes two switches Q1, Q4 connected in series between two poles of the power source 4, a leg terminal defined as a connection point between two switches Q1, Q4. The switch Q1 is coupled in parallel with the diode D1, the switch Q4 is coupled in parallel with the diode D4.

The leg circuit Lg2 includes two switches Q2, Q3 connected in series between two poles of the power source 4, a leg terminal defined as a connection point between two switches Q2, Q3, and two diodes D2, D3. The switch Q2 is coupled in parallel with the diode D2, the switch Q3 is coupled in parallel with the diode D3.

In other embodiments, the leg circuit Lg1 includes more than two switches connected in series between two poles of the power source 4, the leg circuit Lg2 also includes more than two switches connected in series between two poles of the power source 4.

For each of the bridge circuits Bg1, Bg2, . . . Bgn; as a non-limiting example, switches Q1, Q2, Q3 and Q4 can be IGBTs (Insulated Gate Bipolar Transistor), or power MOS-FETs (Metal Oxide Semiconductor Field Effect Transistor), or BJT (Bipolar Junction Transistor), or other controllable semiconductor devices, etc.

In the embodiment, each of the bridge circuit voltages U1, U2, . . . Un is defined as a voltage between two leg terminals of two corresponding leg circuits Lg1, Lg2.

The structure and the function of the bridge circuits Bg1, Bg2, . . . Bgn are substantially the same. Taking the bridge circuits Bg1, Bg2, and Bgn as examples, the leg terminal of the leg circuit Lg1 of the bridge circuit Bg1 is labeled as L1, and the leg terminal of the leg circuit Lg2 of the bridge circuit Bg1 is labeled as R1, the bridge circuit voltage U1 is calculated by formula: U1=VL1−VRE Where VL1 and VR1 are the respective voltage potentials of the leg terminals L1 and R1.

The leg terminal of the leg circuit Lg1 of the bridge circuit Bg2 is labeled as L2, and the leg terminal of the leg circuit Lg2 of the bridge circuit Bg2 is labeled as R2, the bridge circuit voltage U2 is calculated by formula: U2=VL2−VR2. Where VL2 and VR2 are the respective voltage potentials of the leg terminals L2 and R2.

The leg terminal of the leg circuit Lg1 of the bridge circuit Bgn is labeled as Ln, and the leg terminal of the leg circuit Lg2 of the bridge circuit Bgn is labeled as Rn, the bridge circuit voltage Un is calculated by formula: Un=VLn−VRn. Where VLn and VRn are the respective voltage potentials of the leg terminals Ln and Rn.

The processing device 104 is configured for controlling the switches Q1, Q2, Q3, Q4 to be turned on or turned off.

In one embodiment, the processing device 104 is configured to calculate a switch junction temperature for a bonding wire in each switch Q1, Q2, Q3 or Q4 based at least in part on a power loss of the switch; generate a first accumulated fatigue damage of the bonding wire in each switch Q1, Q2, Q3 or Q4 based on the switch junction temperature; and generate an estimated remaining lifetime of the switching amplifier 100 based on the first accumulated fatigue damages of the bonding wires in the respective switches Q1, Q2, Q3, and Q4 of each of the bridge circuits Bg1, Bg2, . . . Bgn.

In detail, the processing device 104 generates the first accumulated fatigue damage of the bonding wire in each switch Q1, Q2, Q3 or Q4 based on peak values and valley values of the switch junction temperature.

In another embodiment, the processing device 104 is further configured to calculate a case temperature for a solder layer in each switch Q1, Q2, Q3 or Q4 based at least in part on an average value of the power loss of the switch and a power loss of the corresponding diode D1, D2, D3 or D4; generate an accumulated fatigue damage of the solder layer in each switch Q1, Q2, Q3 or Q4 based on the case temperature; and generate the estimated remaining lifetime of the switching amplifier 100 based on at least one of the first accumulated fatigue damages of the bonding wires in the respective switches Q1, Q2, Q3, and Q4 of each of the bridge circuits Bg1, Bg2, . . . Bgn and the accumulated fatigue damages of the solder layers in the respective switches Q1, Q2, Q3, and Q4 of each of the bridge circuits Bg1, Bg2, . . . Bgn.

In detail, the processing device 104 generates the accumulated damage of the solder layer in each switch Q1, Q2, Q3 or Q4 based on peak values and valley values of the case temperature.

Wherein the estimated remaining lifetime of the switching amplifier 100 is generated based on a maximum value of the first accumulated fatigue damages of the bonding wires in the respective switches Q1, Q2, Q3, and Q4 of each of the bridge circuits Bg1, Bg2, . . . Bgn; and the accumulated fatigue damages of the solder layers in the respective switches Q1, Q2, Q3, and Q4 of each of the bridge circuits Bg1, Bg2, . . . Bgn.

In yet another embodiment, the processing device 104 is further configured to calculate a diode junction temperature for the bonding wire in the corresponding switch Q1, Q2, Q3 or Q4 based at least in part on the power loss of each diode D1, D2, D3 or D4; generate a second accumulated fatigue damage of the bonding wire in each switch Q1, Q2, Q3 or Q4 based on the corresponding diode junction temperature, and generate the estimated remaining lifetime of the switching amplifier 100 based on at least one of the first accumulated fatigue damages of the bonding wires in the respective switches Q1, Q2, Q3, and Q4 of each of the bridge circuits Bg1, Bg2, . . . Bgn; the second accumulated fatigue damages of the bonding wires in the respective switches Q1, Q2, Q3, and Q4 of each of the bridge circuits Bg1, Bg2, . . . Bgn; and the accumulated fatigue damages of the solder layers in the respective switches Q1, Q2, Q3, and Q4 of each of the bridge circuits Bg1, Bg2, . . . Bgn.

In detail, the processing device 104 generate the second accumulated fatigue damage of the bonding wire in each switch Q1, Q2, Q3 or Q4 based on peak values and valley values of the corresponding diode junction temperature.

Wherein the estimated remaining lifetime of the switching amplifier 100 is generated based on a maximum value of the first accumulated fatigue damages of the bonding wires in the respective switches Q1, Q2, Q3, and Q4 of each of the bridge circuits Bg1, Bg2, . . . Bgn; the second accumulated fatigue damages of the bonding wires in the respective switches Q1, Q2, Q3, and Q4 of each of the bridge circuits Bg1, Bg2, . . . Bgn; and the accumulated fatigue damages of the solder layers in the respective switches Q1, Q2, Q3, and Q4 of each of the bridge circuits Bg1, Bg2, . . . Bgn.

In the embodiment, the estimated remaining lifetime of the switching amplifier 100 is generated in real time.

Figure 2:
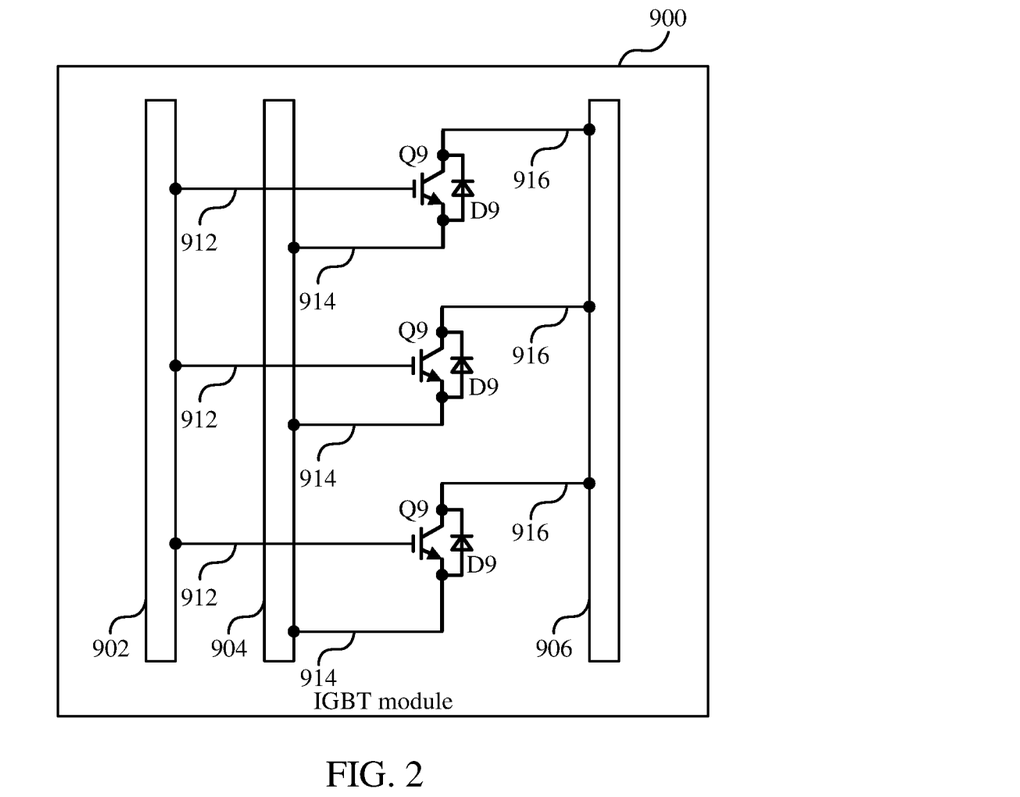
FIG. 2 illustrates a structure of the IGBT module in accordance with an exemplary embodiment.

FIG. 2 illustrates a structure of a IGBT module 900 in accordance with an exemplary embodiment. The IGBT module 900 includes three IGBTs Q9 coupled in parallel with three respective diodes D9. Three gates of the IGBTs Q9 are electrically coupled to a copper bar 902 through three respective bonding wires 912. Three emitters of the IGBTs Q9 are electrically coupled to a copper bar 904 through three respective bonding wires 914. Three collectors of the IGBTs Q9 are electrically coupled to a copper bar 906 through three respective bonding wires 916. Each of the switches Q1, Q2, Q3, Q4, as shown in FIG. 1, may be the IGBT Q9, for example. The bonding wire in each of the switches Q1, Q2, Q3, Q4, as shown in FIG. 1, may be the bonding wire 912, the bonding wire 914, or the bonding wire 916, for example.

Figure 3:
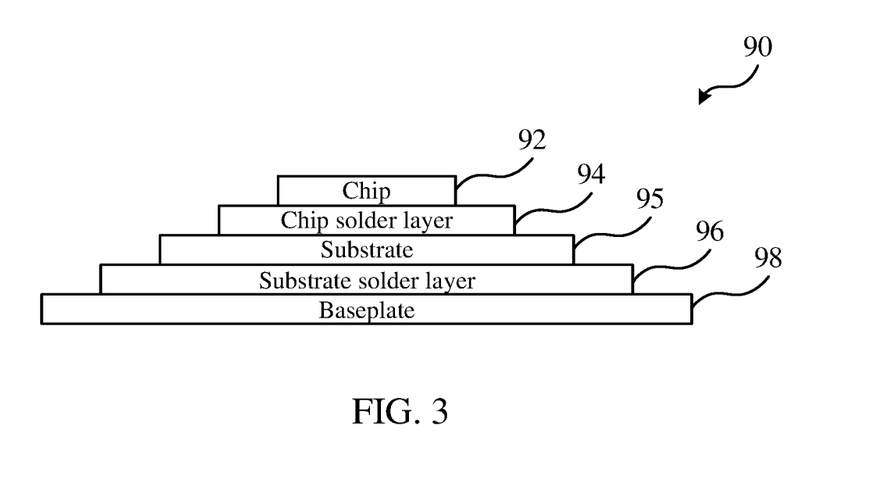
FIG. 3 illustrates a structure of the IGBT in accordance with an exemplary embodiment.

FIG. 3 illustrates a structure of the IGBT 90 in accordance with an exemplary embodiment. The structure of the IGBT 90 includes a chip 92, a chip solder layer 94, a substrate 95, a substrate solder layer 96, and a base plate 98. The substrate 95 may be made of copper, the base plate 98 may be made of aluminum nitride ceramic, for example. In the embodiment, the case temperature for the solder layer in each of the switches Q1, Q2, Q3, and Q4, as shown in FIG. 1, can be the temperature of the substrate solder layer 96. In other embodiments, the case temperature for the solder layer in each of the switches Q1, Q2, Q3, and Q4, as shown in FIG. 1, can be the temperature of the chip solder layer 94.

Figure 4:
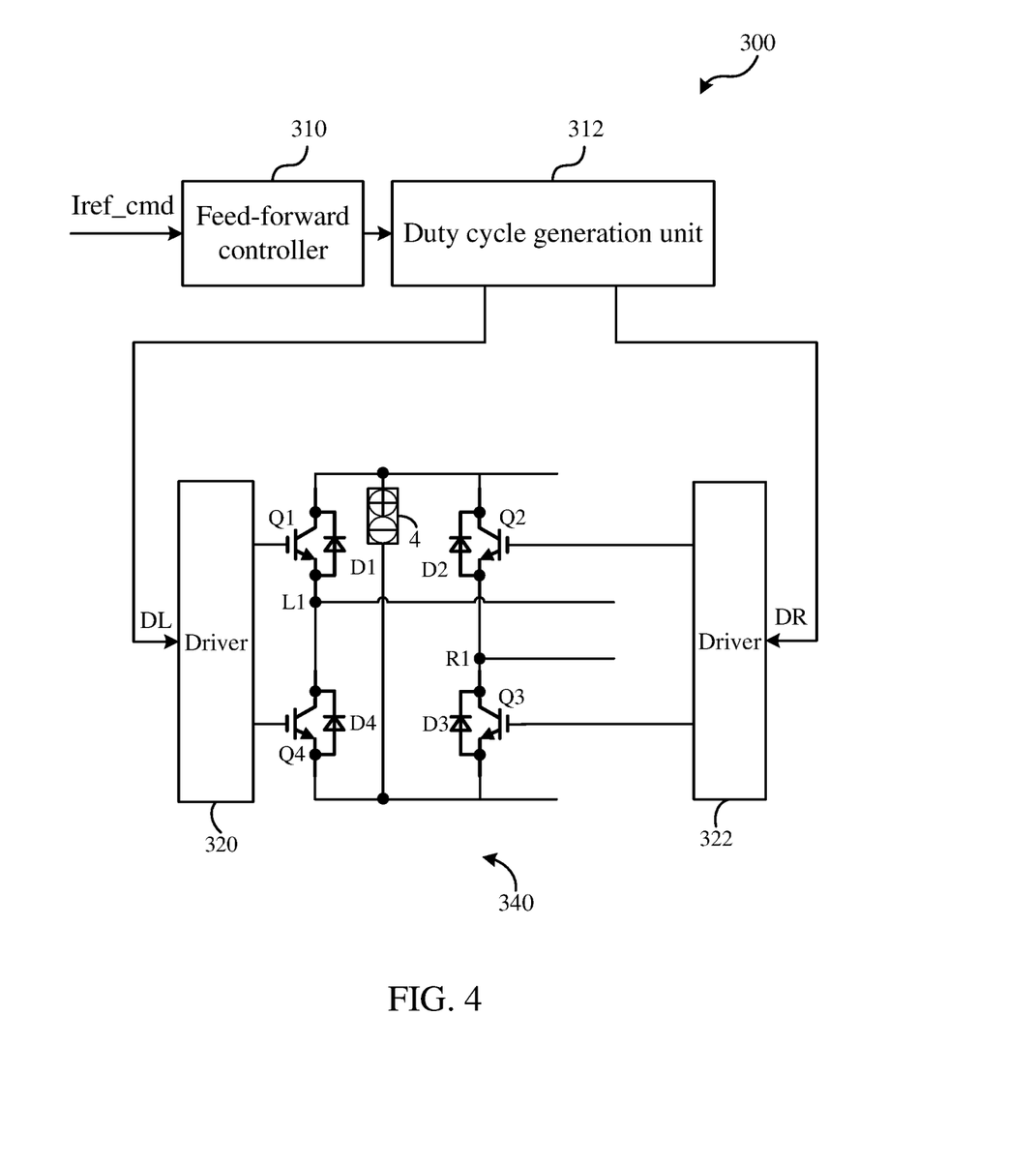
FIG. 4 illustrates a control device for controlling operations of the bridge circuit in accordance with an exemplary embodiment.

FIG. 4 illustrates a control device 300 for controlling operations of the bridge circuit 340 in accordance with an exemplary embodiment. The control device 300 may be a part of the processing device 104 in FIG. 1, for example. Each of the bridge circuits Bg1, Bg2, . . . Bgn in FIG. 1 may be the bridge circuit 340 for example.

The control device 300 is configured for generating a first duty cycle DL and a second duty cycle DR. The control device 300 includes drivers 320, 322. The switches Q1, Q4 are coupled to the driver 320, the switches Q2, Q3 are coupled to the driver 322.

The driver 320 is configured for receiving the first duty cycle DL, and ensuring a duty cycle of the switch Q1 is equivalent to DL and a duty cycle of the switch Q4 is equivalent to 1−DL. The driver 322 is configured for receiving the second duty cycle DR, and ensuring a duty cycle of the switch Q2 is equivalent to DR and a duty cycle of the switch Q3 is equivalent to 1−DR. The duty cycle of the diode D1 is equivalent to DL, the duty cycle of the diode D4 is equivalent to 1−DL. The duty cycle of the diode D2 is equivalent to DR, the duty cycle of the diode D3 is equivalent to 1−DR. DL is the effective duty cycle when the switch Q1 or the diode D1 is conducting or turned on. 1−DL is the effective duty cycle when the switch Q4 or the diode D4 is conducting or turned on. DR is the effective duty cycle when the switch Q2 or the diode D2 is conducting or turned on. 1−DR is the effective duty cycle when the switch Q 3 or the diode D3 is conducting or turned on.

The control device 300 further includes a feed-forward controller 310, and a duty cycle generation unit 312. The feed-forward controller 310 is configured for generating a feed-forward voltage command according to a reference current command Iref_cmd. As a non-limiting example, the feed-forward controller 310 may be a proportional amplifier, or other controllers.

The duty cycle generation unit 312 is configured for generating the first duty cycle DL and the second duty cycle DR according to the feed-forward voltage command The first duty cycle DL and the second duty cycle DR are calculate by the following formulas (1.1), (1.2), (1.3):

$$V+2\times n\times Vce\_drop = 4Vdc\times Dc \quad (1.1)$$

$$DL = 0.5 + 0.5\times Dc \quad (1.2)$$

$$DR = 0.5 - 0.5\times Dc \quad (1.3)$$

Where V is the feed-forward voltage command, Vdc is the DC voltage of the power source 4, n is a total number of bridge circuits included in the switching amplifier 100; Vce_drop is the forward voltage drop during the switch Q1, Q2, Q3, or Q4 is conducting or turned on.

Figure 5:
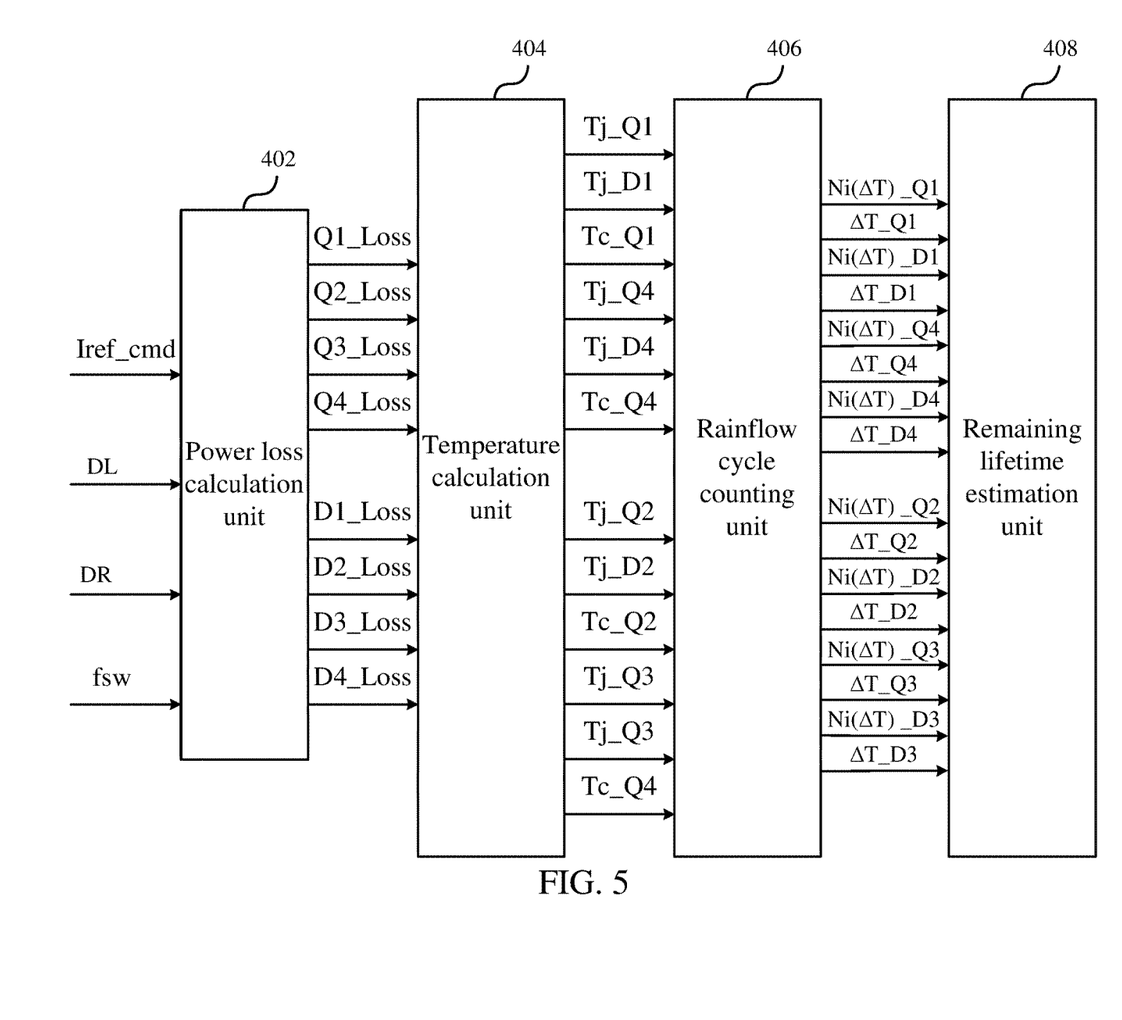
FIG. 5 is a block diagram of the processing device in accordance with an exemplary embodiment.

Referring to FIG. 5, the processing device 104 of FIG. 1 further includes a power loss calculation unit 402, a temperature calculation unit 404, a rainflow cycle counting unit 406, and a remaining lifetime estimation unit 408.

The power loss of each of the switches Q1, Q2, Q3, Q4 is calculated by the power loss calculation unit 402 according to a duty cycle of the switch, a switching frequency of the switch, and a reference current command Iref_cmd.

The power loss of each of the diodes D1, D2, D3, D4 is calculated by the power loss calculation unit 402 according to a duty cycle of the diode, a switching frequency of the corresponding switch, and the reference current command Iref_cmd.

In detail, the power loss of each of the switches Q1, Q2, Q3, Q4 includes a conduction loss, a turn-on switching loss, and a turn-off switching loss. The conduction losses Pcon_Q1, Pcon_Q2, Pcon_Q3, Pcon_Q4 of the switches Q1, Q2, Q3, Q4 are calculated by the formula (2.1):

$$Pcon\_Q1 = Vce\_Q1\times I\times DL;$$

$$Pcon\_Q4 = Vce\_Q4\times I\times(1-DL);$$

$$Pcon\_Q2 = Vce\_Q2\times I\times DR;$$

$$Pcon\_Q3 = Vce\_Q3\times I\times(1-DR); \quad (2.1)$$

Where Vce_Q1 is the forward voltage drop during the switch Q1 is conducting or turned on; Vce_Q4 is the forward voltage drop during the switch Q4 is conducting or turned on; Vce_Q2 is the forward voltage drop during the switch Q2 is conducting or turned on; Vce_Q3 is the forward voltage drop during the switch Q3 is conducting or turned on; I is the reference current command The turn-on switching loss Pon_sw of each of the switches Q1, Q2, Q3, Q4 is calculated by the formula (2.2):

$$Pon\_sw = (a2\times I^2 + a1\times I + a0)\times fsw \quad (2.2)$$

Where fsw is a switching frequency command, a2, a1, and a0 are the constant value.

The turn-off switching loss Poff of each of the switches Q1, Q2, Q3, Q4 is calculated by the formula (2.3):

$$Poff\_sw = (b2\times I^2 + b1\times I + b0)\times fsw \quad (2.3)$$

where b2, b1, and b0 are constant values.

In detail, the power loss of each of the diodes D1, D2, D3, D4 includes a conduction loss and a turn-off switching loss. A turn-on switching loss of each of the diodes D1, D2, D3, D4 are ignored due to the fact that the diode turn-on switching loss can be negligible. The conduction losses Pcon_D1, Pcon_D2, Pcon_D3, Pcon_D4 of the diodes D1, D2, D3, D4 are calculated by the formula (2.4):

$$Pcon\_D1 = Vf\_D1\times I\times DL;$$

$$Pcon\_D4 = Vf\_D4\times I\times(1-DL);$$

$$Pcon\_D2 = Vf\_D2 \times I \times DR;$$

$$Pcon\_D3 = Vf\_D3 \times I \times (1-DR); \quad (2.4)$$

Where Vf_D1 is the forward voltage drop during the diode D1 is conducting or turned on; Vf_D4 is the forward voltage drop during the diode D4 is conducting or turned on; Vf_D2 is the voltage drop during the diode D2 is conducting or turned on; Vf_D3 is the voltage drop during the diode D3 is conducting or turned on; I is the reference current command The turn-off switching loss Poff_diode of each of the diodes D1, D2, D3, D4 is calculated by the formula (2.5):

$$Poff\_d = (c2 \times I^2 + c1 \times I + c0) \times fsw \quad (2.5)$$

where c2, c1, and c0 are constant values.

Therefore, Q1_Loss=Pcon_Q1+Pon_sw+Poff_sw=Vce_Q1×I×DL+(a2×I²+a1×I+a0)×fsw+(b2×I²+b1×I+b0)×fsw; where Q1_Loss is the power loss of the switch Q1.

Q2_Loss=Pcon_Q2+Pon_sw+Poff_sw=Vce_Q2×I×DR+(a2×I²+a1×I+a0)×fsw+(b2×I²+b1×I+b0)×fsw; where Q2_Loss is the power loss of the switch Q2.

Q3_Loss=Pcon_Q3+Pon_sw+Poff_sw=Vce_Q3×I×(1−DR)+(a2×I²+a1×I+a0)×fsw+(b2×I²+b1×I+b0)×fsw; where Q3_Loss is the power loss of the switch Q3.

Q4_Loss=Pcon_Q4+Pon_sw+Poff_sw=Vce_Q4×I×(1−DL)+(a2×I²+a1×I+a0)×fsw+(b2×I²+b1×I+b0)×fsw; where Q4_Loss is the power loss of the switch Q4.

D1_Loss=Pcon_D1+Poff_d=Vf_D1×I×DL+(c2×I²+c1×I+c0)×fsw; where D1_Loss is the power loss of the diode D1.

D2_Loss=Pcon_D2+Poff_d=Vf_D2×I×DR+(c2×I²+c1×I+c0)×fsw; where D2_Loss is the power loss of the diode D2.

D3_Loss=Pcon_D3+Poff_d=Vf_D3×I×(1−DR)+(c2×I²+c1×I+c0)×fsw; where D3_Loss is the power loss of the diode D3.

D4_Loss=Pcon_D4+Poff_d=Vf_D4×I×(1−DL)+(c2×I²+c1×I+c0)×fsw; where D4_Loss is the power loss of the diode D4.

The switch junction temperatures Tj_Q1, Tj_Q2, Tj_Q3, Tj_Q4 are calculated by the temperature calculation unit 404 according to the power losses Q1_Loss, Q2_Loss, Q3_Loss, Q4_Loss of the switches Q1, Q2, Q3, Q4, respectively.

The diode junction temperatures Tj_D1, Tj_D2, Tj_D3, Tj_D4 are calculated by the temperature calculation unit 404 according to the power losses D1_Loss, D2_Loss, D3_Loss, D4_Loss of the diodes D1, D2, D3, D4, respectively.

The case temperatures Tc_Q1, Tc_Q2, Tc_Q3, Tc_Q4 are calculated by the temperature calculation unit 404 according to an average value of the power losses Q1_Loss, Q2_Loss, Q3_Loss, Q4_Loss of the switches Q1, Q2, Q3, Q4 and the power losses D1_Loss, D2_Loss, D3_Loss, D4_Loss of the diodes D1, D2, D3, D4, respectively.

The switches Q1, Q2, Q3, Q4 are thermally coupled to a heatsink (not shown) through thermal grease (not shown).

In detail, the temperature calculation unit 404 is configured to use a thermal model of each of the switches Q1, Q2, Q3, Q4 with the heatsink to calculate the switch junction temperature.

Figure 6:
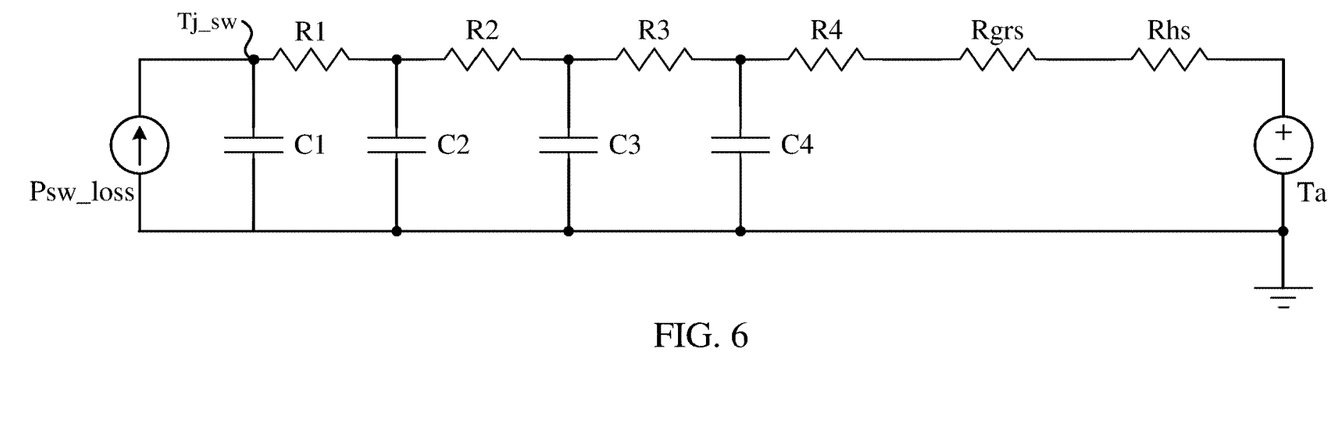
FIG. 6 illustrates a thermal model of each switch with the heatsink in accordance with an exemplary embodiment.

The thermal model of each of the switches Q1, Q2, Q3, Q4 with the heatsink is shown in FIG. 6.

Psw_loss is a current source representing the power loss of each of the switches Q1, Q2, Q3, Q4.

Ta is a voltage source representing an ambient temperature. Rgrs represents the thermal resistance of the thermal grease. Rhs represents the thermal resistance of the heatsink.

Referring back to FIG. 3, R1 represents the thermal resistance between the chip 92 and the chip solder 94. C1 represents the thermal capacitance between the chip 92 and the chip solder 94. R2 represents the thermal resistance between the chip solder 94 and the substrate 95. C2 represents the thermal capacitance between the chip solder 94 and the substrate 95. R3 represents the thermal resistance between the substrate 95 and the substrate solder 96. C3 represents the thermal capacitance between the substrate 95 and the substrate solder 96. R4 represents the thermal resistance between the substrate solder 96 and the baseplate 98. C4 represents the thermal capacitance between the substrate solder 96 and the baseplate 98.

Tj_sw is a voltage of the connection point between R1 and C1, Tj_sw represents the junction temperature of each of the switches Q1, Q2, Q3, Q4.

For the thermal model of the switch Q1 with the heatsink, Psw_loss is equivalent to the power loss Q1_Loss of the switch Q1. The thermal model of the switch Q1 with the heatsink is inputted to Matlab, and the junction temperature Tj_Q1 of the switch Q1 is calculated by Matlab. The junction temperature Tj_Q1 of the switch Q1 is equivalent to Tj_sw.

For the thermal model of the switch Q2 with the heatsink, Psw_loss is equivalent to the power loss Q2_Loss of the switch Q2. The thermal model of the switch Q2 with the heatsink is inputted to Matlab, and the junction temperature Tj_Q2 of the switch Q2 is calculated by Matlab. The junction temperature Tj_Q2 of the switch Q2 is equivalent to Tj_sw.

For the thermal model of the switch Q3 with the heatsink, Psw_loss is equivalent to the power loss Q3_Loss of the switch Q3. The thermal model of the switch Q3 with the heatsink is inputted to Matlab, and the junction temperature Tj_Q3 of the switch Q3 is calculated by Matlab. The junction temperature Tj_Q3 of the switch Q3 is equivalent to Tj_sw.

For the thermal model of the switch Q4 with the heatsink, Psw_loss is equivalent to the power loss Q4_Loss of the switch Q4. The thermal model of the switch Q4 with the heatsink is inputted to Matlab, and the junction temperature Tj_Q4 of the switch Q4 is calculated by Matlab. The junction temperature Tj_Q4 of the switch Q4 is equivalent to Tj_sw.

Figure 7:
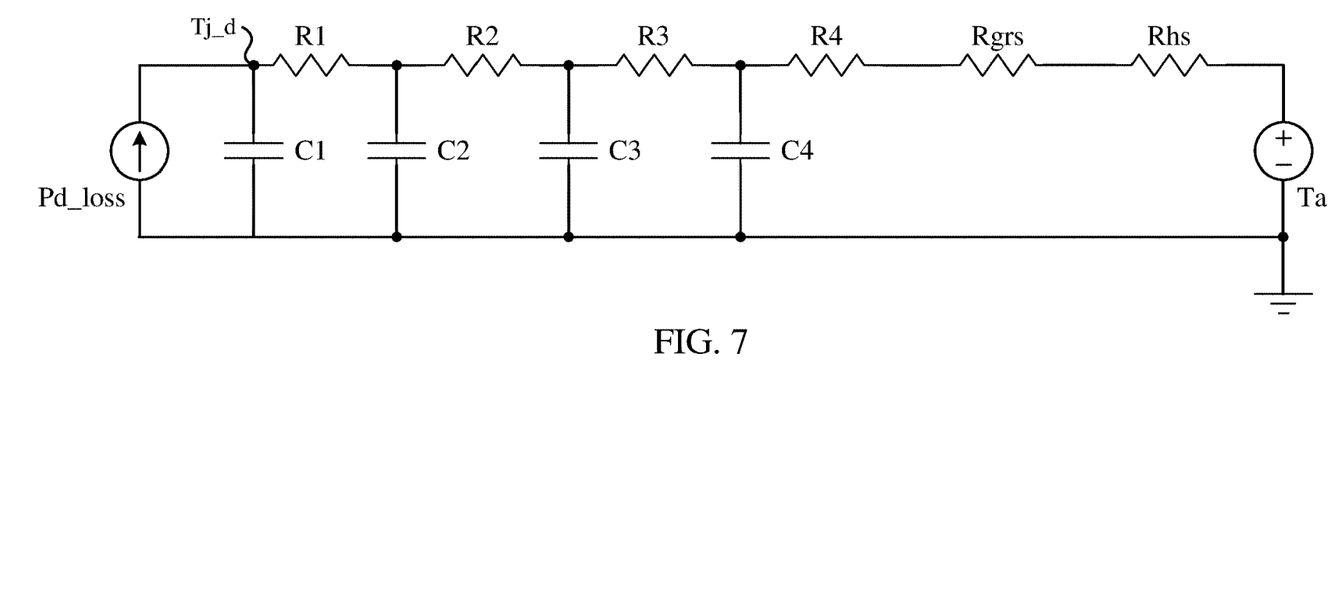
FIG. 7 illustrates a thermal model of each diode with the heatsink in accordance with an exemplary embodiment.

In detail, the temperature calculation unit 404 is further configured to use a thermal model of each of the diodes D1, D2, D3, D4 with the heatsink to calculate the diode junction temperature.

The thermal model of each of the diodes D1, D2, D3, D4 with the heatsink is shown in FIG. 7. Similar to FIG. 6, Pd_loss is a current source representing the power loss of each of the diodes D1, D2, D3, D4. Tj_d is a voltage of the connection point between R1 and C1, Tj_d represents the junction temperature of each of the diodes D1, D2, D3, D4.

For the thermal model of the diode D1 with the heatsink, Pd_loss is equivalent to the power loss D1_Loss of the diode D1. The thermal model of the diode D1 with the heatsink is inputted to Matlab, and the junction temperature Tj_D1 of the diode D1 is calculated by Matlab. The junction temperature Tj_D1 of the diode D1 is equivalent to Tj_d.

For the thermal model of the switch Q2 with the heatsink, Pd_loss is equivalent to the power loss D2_Loss of the diode D2. The thermal model of the diode D2 with the heatsink is inputted to Matlab, and the junction temperature Tj_D2 of the diode D2 is calculated by Matlab. The junction temperature Tj_D2 of the diode D2 is equivalent to Tj_d.

For the thermal model of the diode D3 with the heatsink, Pd_loss is equivalent to the power loss D3_Loss of the diode D3. The thermal model of the diode D3 with the heatsink is inputted to Matlab, and the junction temperature Tj_D3 of the diode D3 is calculated by Matlab. The junction temperature Tj_D3 of the diode D3 is equivalent to Tj_d.

For the thermal model of the diode D4 with the heatsink, Pd_loss is equivalent to the power loss D4_Loss of the diode D4. The thermal model of the diode D4 with the heatsink is inputted to Matlab, and the junction temperature Tj_D4 of the diode D4 is calculated by Matlab. The junction temperature Tj_D4 of the diode D4 is equivalent to Tj_d.

Figure 8:
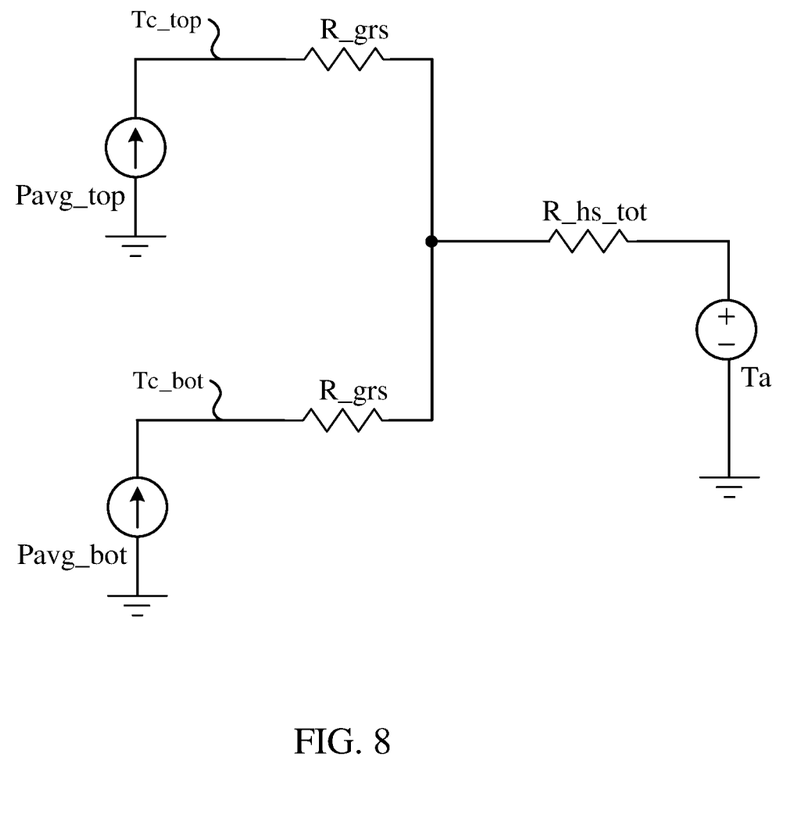
FIG. 8 illustrates a thermal model of each switch with the corresponding diode and the heatsink in accordance with an exemplary embodiment.

In detail, the temperature calculation unit 404 is further configured to use a thermal model of each switch Q1, Q2, Q3, or Q4 with the corresponding diode D1, D2, D3, or D4 and the heatsink, as shown in FIG. 8, to calculate the case temperature.

For calculation of the case temperature Tc_Q1, Tc_Q4, Pavg_top is the average value of the power loss Q1_Loss of the switch Q1 and the power loss D1_Loss of the corresponding diode D1 that is functioned as a current source applied to the thermal model of the switch Q1 with the corresponding diode D1 and the heatsink. Pavg_bot is the average value of the power loss Q4_Loss of the switch Q4 and the power loss D4_Loss of the corresponding diode D4 is functioned as a current source applied to the thermal model of the switch Q4 with the corresponding diode D4 and the heatsink. Tc_top is a voltage of a connection point between the current source Pavg_top and the thermal resistance Rgrs. Tc_bot is a voltage of a connection point between the current source Pavg_bot and the thermal resistance Rgrs. Therefore, the case temperature Tc_Q1 of the switch Q1 is equivalent to Tc_top. The case temperature Tc_Q4 of the switch Q4 is equivalent to Tc_bot.

Tc_top and Tc_bot is calculated by the following formula (3.1):

$$\begin{cases} T_{c\_top}(n) = (R\_grs + R\_hs\_tot) \cdot P_{avg\_top}(n) + \\ \qquad R\_hs\_tot \cdot P_{avg\_bot}(n) + T_a \\ T_{c\_bot}(n) = (R\_grs + R\_hs\_tot) \cdot P_{avg\_top}(n) + \\ \qquad R\_hs\_tot \cdot P_{avg\_top}(n) + T_a \end{cases} \quad (3.1)$$

Where R_hs_tot is the thermal resistance of the heatsink, R_grs is the thermal resistance of the thermal grease.

For calculation of the case temperature Tc_Q2, Tc_Q3, Pavg_top is the average value of the power loss Q2_Loss of the switch Q2 and the power loss D2_Loss of the corresponding diode D2 and is functioned as a current source applied to the thermal model of the switch Q2 with the corresponding diode D2 and the heatsink. Pavg_bot is the average value of the power loss Q3_Loss of the switch Q3 and the power loss D3_Loss of the corresponding diode D3 and is functioned as a current source applied to the thermal model of the switch Q3 with the corresponding diode D3 and the heatsink. The case temperature Tc_Q2 of the switch Q2 is equivalent to Tc_top. The case temperature Tc_Q3 of the switch Q3 is equivalent to Tc_bot.

Figure 9:
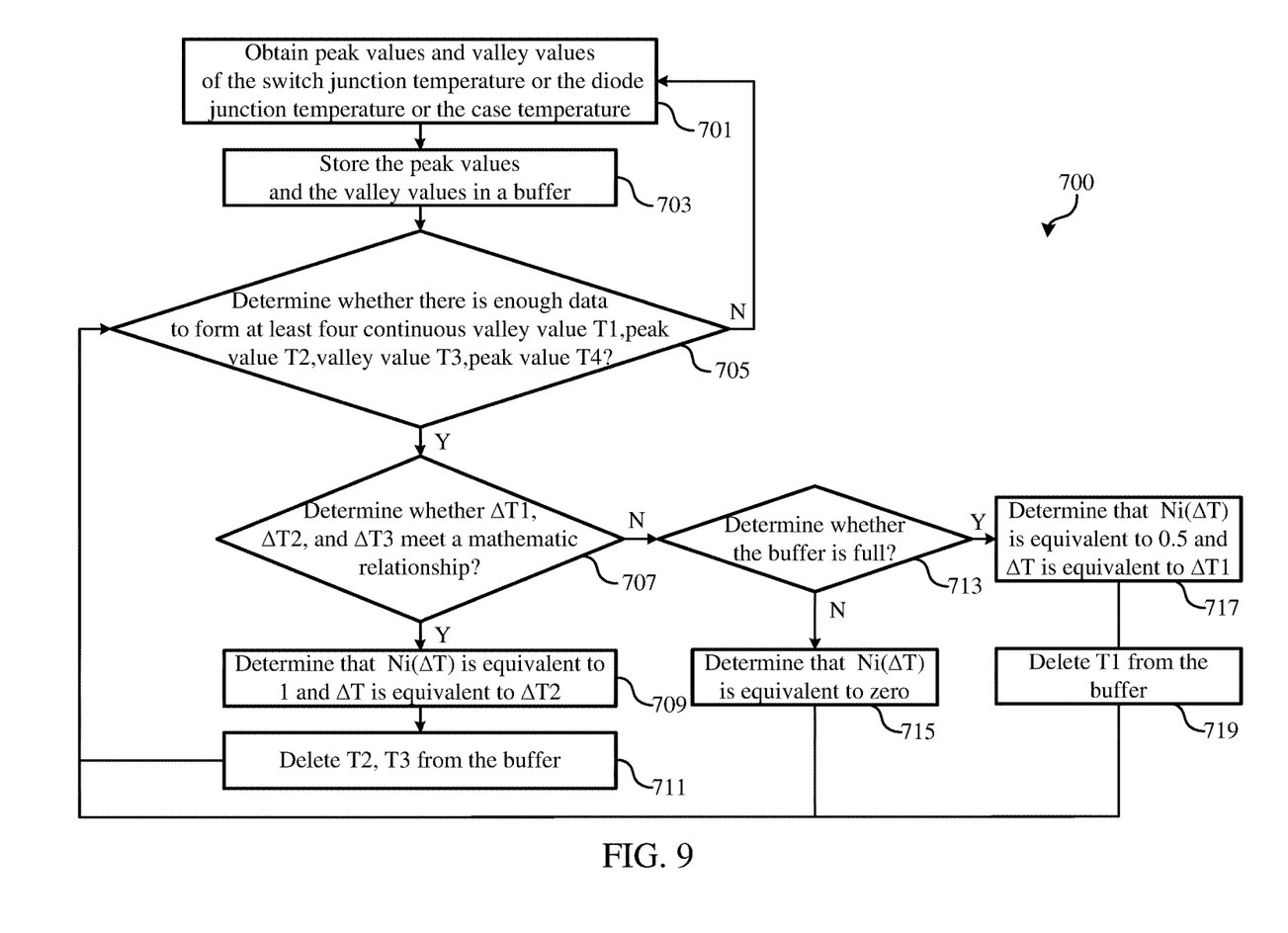
FIG. 9 illustrates a method for executing a rainflow algorithm to calculate the first accumulated fatigue damage of the bonding wire in each switch, or the second accumulated fatigue damage of the bonding wire in each switch, or the accumulated fatigue damage of the solder layer in each switch in accordance with an exemplary embodiment.

FIG. 9 illustrates a method 700 for executing a rainflow algorithm to calculate the first accumulated fatigue damage of the bonding wire in each of the switches Q1, Q2, Q3 and Q4; or the second accumulated fatigue damage of the bonding wire in each of the switches Q1, Q2, Q3 and Q4; or the accumulated fatigue damage of the solder layer in each of the switches Q1, Q2, Q3 and Q4 in accordance with an exemplary embodiment. The method 700 includes following steps. The rainflow algorithm is performed in the rainflow cycle counting unit 406.

Step 701: the processing device 104 obtains peak values and valley values of each of the switch junction temperatures Tj_Q1, Tj_Q2, Tj_Q3, Tj_Q4 or each of the diode junction temperatures Tj_D1, Tj_D2, Tj_D3, Tj_D4 or each of the case temperatures Tc_Q1, Tc_Q2, Tc_Q3, Tc_Q4.

Step 703: the processing device 104 stores the peak values and the valley values in a buffer.

Figure 10:
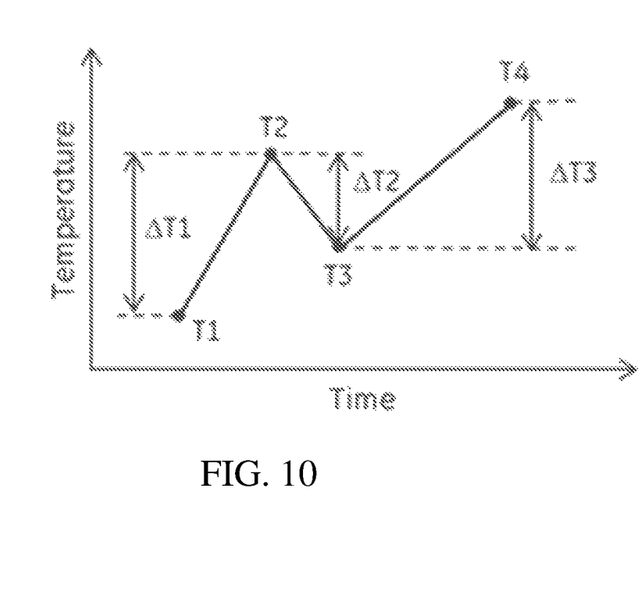
FIG. 10 illustrates four continuous valley value T1, peak value T2, valley value T3, peak value T4 in accordance with one exemplary embodiment.
Figure 11:
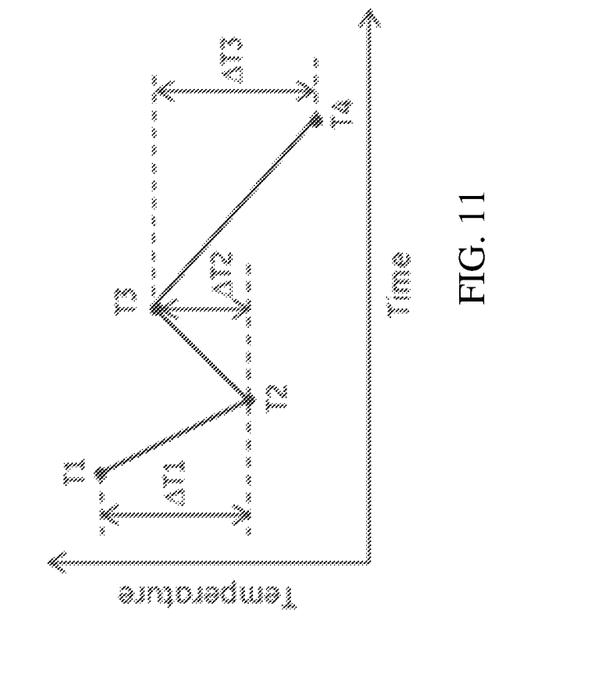
FIG. 11 illustrates four continuous peak value T1, valley value T2, peak value T3, valley value T4 in accordance with another exemplary embodiment.

Step 705: in the embodiment, the processing device 104 determines whether there is enough data to form at least four continuous valley value T1, peak value T2, valley value T3, peak value T4 (as shown in FIG. 10) or at least four continuous peak value T1, valley value T2, peak value T3, valley value T4 (as shown in FIG. 11). If yes, the process goes to the step 707. Otherwise, the process returns to the step 701.

Step 707: the processing device 104 determines whether ΔT1, ΔT2, and ΔT3 meet following mathematic relationship (9.1), where ΔT1, ΔT2, and ΔT3 are represented temperature ranges of T1 to T2, T2 to T3, and T3 to T4, respectively. If yes, the process goes to the step 709. Otherwise, the process goes to the step 713.

$$\Delta T_1 \geq \Delta T_2 \leq \Delta T_3 \quad (9.1)$$

Step 709: the processing device 104 determines that the cycle formation number Ni(ΔT) is equivalent to 1 and corresponding temperature difference ΔT is equivalent to ΔT2.

Step 711: the processing device 104 deletes T2 and T3 from the buffer. After performing the step 711, the process returns to perform the step 705.

Step 713: the processing device 104 determines whether the buffer is full. If yes, the process goes to the step 717. Otherwise, the process goes to the step 715.

Step 715: the processing device 104 determines that cycle formation number Ni(ΔT) is equivalent to zero. After performing the step 715, the process returns to perform the step 705.

Step 717: the processing device 104 determines that cycle formation number Ni(ΔT) is equivalent to 0.5 and corresponding temperature difference ΔT is equivalent to ΔT1.

Step 719: the processing device 104 deletes T1 from the buffer. After performing the step 719, the process returns to perform the step 705.

The cycle formation number Ni(ΔT)_Q1 and corresponding temperature difference ΔT_Q1 for the switch Q1 are calculated based on peak values and valley values of the switch junction temperature Tj_Q1 by the rainflow algorithm performed in the rainflow cycle counting unit 406.

The cycle formation number Ni(ΔT)_Q2 and corresponding temperature difference ΔT_Q2 for the switch Q2 are calculated based on peak values and valley values of the switch junction temperature Tj_Q2 by the rainflow algorithm performed in the rainflow cycle counting unit 406.

The cycle formation number Ni(ΔT)_Q3 and corresponding temperature difference ΔT_Q3 for the switch Q3 are calculated based on peak values and valley values of the switch junction temperature Tj_Q3 by the rainflow algorithm performed in the rainflow cycle counting unit 406.

The cycle formation number Ni(ΔT)_Q4 and corresponding temperature difference ΔT_Q4 for the switch Q4 are calculated based on peak values and valley values of the switch junction temperature Tj_Q4 by the rainflow algorithm performed in the rainflow cycle counting unit 406.

The cycle formation number $N_i(\Delta T)\_D1$ and corresponding temperature difference $\Delta T\_D1$ for the diode D1 are calculated based on peak values and valley values of the diode junction temperature $Tj\_D1$ by the rainflow algorithm performed in the rainflow cycle counting unit 406.

The cycle formation number $N_i(\Delta T)\_D2$ and corresponding temperature difference $\Delta T\_D2$ for the diode D2 are calculated based on peak values and valley values of the diode junction temperature $Tj\_D2$ by the rainflow algorithm performed in the rainflow cycle counting unit 406.

The cycle formation number $N_i(\Delta T)\_D3$ and corresponding temperature difference $\Delta T\_D3$ for the diode D3 are calculated based on peak values and valley values of the diode junction temperature $Tj\_D3$ by the rainflow algorithm performed in the rainflow cycle counting unit 406.

The cycle formation number $N_i(\Delta T)\_D4$ and corresponding temperature difference $\Delta T\_D4$ for the diode D4 are calculated based on peak values and valley values of the diode junction temperature $Tj\_D4$ by the rainflow algorithm performed in the rainflow cycle counting unit 406.

The cycle formation number $N_i(\Delta T)\_Q1'$ and corresponding temperature difference $\Delta T\_Q1'$ for the switch Q1 are calculated based on peak values and valley values of the case temperature $Tc\_Q1$ by the rainflow algorithm performed in the rainflow cycle counting unit 406.

The cycle formation number $N_i(\Delta T)\_Q2'$ and corresponding temperature difference $\Delta T\_Q2'$ for the switch Q2 are calculated based on peak values and valley values of the case temperature $Tc\_Q2$ by the rainflow algorithm performed in the rainflow cycle counting unit 406.

The cycle formation number $N_i(\Delta T)\_Q3'$ and corresponding temperature difference $\Delta T\_Q3'$ for the switch Q3 are calculated based on peak values and valley values of the case temperature $Tc\_Q3$ by the rainflow algorithm performed in the rainflow cycle counting unit 406.

The cycle formation number $N_i(\Delta T)\_Q4'$ and corresponding temperature difference $\Delta T\_Q4'$ for the switch Q4 are calculated based on peak values and valley values of the case temperature $Tc\_Q4$ by the rainflow algorithm performed in the rainflow cycle counting unit 406.

Referring back to FIG. 5, the remaining lifetime estimation unit 408 calculates the first accumulated fatigue damage LC of the bonding wire in each of the switches Q1, Q2, Q3, and Q4 or the second accumulated fatigue damage LC of the bonding wire in each of the switches Q1, Q2, Q3, and Q4 or the accumulated fatigue damage LC of the solder layer in each of the switches Q1, Q2, Q3, and Q4 by the following formula (9.2).

$$LC = \sum_{i=1}^{k} \frac{N_i(\Delta T)}{N_{fi}(\Delta T)} \quad (9.2)$$

where $N_{fi}(\Delta T)$ is a predetermined function of $\Delta T$.
In detail, based on the above formula (9.2), $$LC\_Q1 = \sum_{i=1}^{k} \frac{N_i(\Delta T)\_Q1}{N_{fi}(\Delta T)\_Q1},$$

where LC_Q1 is the first accumulated fatigue damage of the bonding wire in the switch Q1 calculated based on the junction temperature of the switch Q1.

$$LC\_Q2 = \sum_{i=1}^{k} \frac{N_i(\Delta T)\_Q2}{N_{fi}(\Delta T)\_Q2},$$

where LC_Q2 is the first accumulated fatigue damage of the bonding wire in the switch Q2 calculated based on the junction temperature of the switch Q2.

$$LC\_Q3 = \sum_{i=1}^{k} \frac{N_i(\Delta T)\_Q3}{N_{fi}(\Delta T)\_Q3},$$

where LC_Q3 is the first accumulated fatigue damage of the bonding wire in the switch Q3 calculated based on the junction temperature of the switch Q3.

$$LC\_Q4 = \sum_{i=1}^{k} \frac{N_i(\Delta T)\_Q4}{N_{fi}(\Delta T)\_Q4},$$

where LC_Q4 is the first accumulated fatigue damage of the bonding wire in the switch Q4 calculated based on the junction temperature of the switch Q4.

$$LC\_D1 = \sum_{i=1}^{k} \frac{N_i(\Delta T)\_D1}{N_{fi}(\Delta T)\_D1},$$

where LC_D1 is the second accumulated fatigue damage of the bonding wire in the switch Q1 calculated based on the junction temperature of the corresponding diode D1.

$$LC\_D2 = \sum_{i=1}^{k} \frac{N_i(\Delta T)\_D2}{N_{fi}(\Delta T)\_D2},$$

where LC_D2 is the second accumulated fatigue damage of the bonding wire in the switch Q2 calculated based on the junction temperature of the corresponding diode D2.

$$LC\_D3 = \sum_{i=1}^{k} \frac{N_i(\Delta T)\_D3}{N_{fi}(\Delta T)\_D3},$$

where LC_D3 is the second accumulated fatigue damage of the bonding wire in the switch Q3 calculated based on the junction temperature of the corresponding diode D3.

$$LC\_D4 = \sum_{i=1}^{k} \frac{N_i(\Delta T)\_D4}{N_{fi}(\Delta T)\_D4},$$

where LC_D4 is the second accumulated fatigue damage of the bonding wire in the switch Q4 calculated based on the junction temperature of the corresponding diode D4.

$$LC\_Q1' = \sum_{i=1}^{k} \frac{N_i(\Delta T)\_Q1'}{N_{fi}(\Delta T)\_Q1'},$$

where LC_Q1' is the accumulated fatigue damage of the solder layer in the switch Q1 calculated based on the case temperature of the switch Q1.

$$LC\_Q2' = \sum_{i=1}^{k} \frac{N_i(\Delta T)\_Q2'}{N_{fi}(\Delta T)\_Q2'},$$

where LC_Q2' is the accumulated fatigue damage of the solder layer in the switch Q2 calculated based on the case temperature of the switch Q2.

$$LC\_Q3' = \sum_{i=1}^{k} \frac{N_i(\Delta T)\_Q3'}{N_{fi}(\Delta T)\_Q3'},$$

where LC_Q3' is the accumulated fatigue damage of the solder layer in the switch Q3 calculated based on the case temperature of the switch Q3.

$$LC\_Q4' = \sum_{i=1}^{k} \frac{N_i(\Delta T)\_Q4'}{N_{fi}(\Delta T)\_Q4'},$$

where LC_Q4' is the accumulated fatigue damage of the solder layer in the switch Q4 calculated based on the case temperature of the switch Q4.

In one embodiment, the remaining lifetime estimation unit 408 further generate an estimated remaining lifetime of the switching amplifier 100 based on the first accumulated fatigue damages LC_Q1, LC_Q2, LC_Q3, LC_Q4 of the bonding wires in the respective switches Q1, Q2, Q3, Q4 of each of the bridge circuits Bg1, Bg2, . . . Bg3.

In another embodiment, the remaining lifetime estimation unit 408 further generate the estimated remaining lifetime of the switching amplifier 100 based on at least one of the first accumulated fatigue damages LC_Q1, LC_Q2, LC_Q3, LC_Q4 of the bonding wires in the respective switches Q1, Q2, Q3, Q4 of each of the bridge circuits Bg1, Bg2, . . . Bgn and the accumulated fatigue damages LC_Q1', LC_Q2', LC_Q3', LC_Q4' of the solder layers in the respective switches Q1, Q2, Q3, Q4 of each of the bridge circuits Bg1, Bg2, . . . Bgn.

In yet another embodiment, the remaining lifetime estimation unit 408 further generate the estimated remaining lifetime of the switching amplifier 100 based on at least one of the first accumulated fatigue damages LC_Q1, LC_Q2, LC_Q3, LC_Q4 in the bonding wires of the respective switches Q1, Q2, Q3, Q4 of each of the bridge circuits Bg1, Bg2, . . . Bgn; the second accumulated fatigue damages LC_D1, LC_D2, LC_D3, LC_D4 in the bonding wires of the respective switches Q1, Q2, Q3, Q4 of each of the bridge circuits Bg1, Bg2, . . . Bgn; and the accumulated fatigue damages LC_Q1', LC_Q2', LC_Q3', LC_Q4' of the solder layers in the respective switches Q1, Q2, Q3, Q4 of each of the bridge circuits Bg1, Bg2, . . . Bgn.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure will not be limited to the particular embodiment disclosed as the best mode contemplated for carrying out this disclosure, but that the disclosure will include all embodiments falling within the scope of the appended claims.

The invention claimed is:

1. A switching amplifier, comprising:
   a power device for powering a load and comprised of a plurality of switches, wherein each of the plurality of switches is coupled in parallel with a diode; and
   a processing device configured to:
      calculate a switch junction temperature for a bonding wire in each switch based at least in part on a power loss of the switch;
      generate a first accumulated fatigue damage of the bonding wire in each switch based on the switch junction temperature;
      calculate a case temperature for a solder layer in each switch based at least in part on an average value of the power loss of the switch and a power loss of the corresponding diode;
      generate an accumulated fatigue damage of the solder layer in each switch based on the case temperature; and
      generate an estimated remaining lifetime of the switching amplifier based on at least one of the first accumulated fatigue damages of the bonding wires in each of the plurality of switches and the accumulated fatigue damages of the solder layers in each of the plurality of switches.

2. The switching amplifier of claim 1, wherein the processing device is further configured to:
   calculate a diode junction temperature for the bonding wire in each switch based at least in part on the power loss of each diode;
   generate a second accumulated fatigue damage of the bonding wire in each switch based on the corresponding diode junction temperature; and
   generate the estimated remaining lifetime of the switching amplifier based on at least one of the first accumulated fatigue damages of the bonding wires in each switch, the second accumulated fatigue damages of the bonding wires in each switch, and the accumulated fatigue damages of the solder layers in each switch.

3. The switching amplifier of claim 2, wherein the processing device is further configured to:
   generate the first accumulated fatigue damage of the bonding wire in each switch based on peak values and valley values of the switch junction temperature;
   generate the second accumulated fatigue damage of the bonding wire in each switch based on peak values and valley values of the corresponding diode junction temperature; and
   generate the accumulated damage of the solder layer in each switch based on peak values and valley values of the case temperature.

4. The switching amplifier of claim 2, wherein the estimated remaining lifetime of the switching amplifier is generated based on a maximum value of the first accumulated fatigue damages of the bonding wires in each switch, the second accumulated fatigue damages of the bonding wires in each switch, and the accumulated fatigue damages of solder layers in each switch.

5. The switching amplifier of claim 1, wherein each of the plurality of switches are thermally coupled to a heatsink; wherein the processing device is further configured for using a thermal model of each switch with the heatsink to calculate the switch junction temperature, the power loss of each switch is functioned as a current source applied to the thermal model of each switch with the heatsink; and wherein the processing device is further configured for using a thermal model of each switch with the corresponding diode and the heatsink to calculate the case temperature, the average value of the power loss of each switch and the power loss of the corresponding diode is functioned as a current source applied to the thermal model of each switch with the corresponding diode and the heatsink.

6. The switching amplifier of claim 2, wherein each of the plurality of switches are thermally coupled to a heatsink; and wherein the processing device is further configured for using a thermal mode of each diode with the heatsink to calculate the diode junction temperature, the power loss of each diode is functioned as a current source applied to the thermal model of the diode with the heatsink.

7. The switching amplifier of claim 1, wherein the power loss of each switch is calculated based on a duty cycle of the switch, a switching frequency command, and a reference current command; and wherein the power loss of each diode is calculated based on a duty cycle of the diode, the switching frequency command, and the reference current command.

8. A method for estimating a remaining lifetime of a switching amplifier that comprises a power device, the power device configured for powering a load and comprised of a plurality of switches, wherein each of the plurality of switches is coupled in parallel with a diode; the method comprising:
calculating a switch junction temperature for a bonding wire in each switch based at least in part on a power loss of the switch;
generating a first accumulated fatigue damage of the bonding wire in each switch based on the switch junction temperature;
calculating a case temperature for a solder layer in each of the plurality of switches based on an average value of the power loss of each switch and a power loss of the corresponding diode;
generating an accumulated fatigue damage of the solder layer in each switch based on the case temperature; and
generating an estimated remaining lifetime of the switching amplifier based on at least one of the first accumulated fatigue damages of the bonding wires in each switch and the accumulated fatigue damages of the solder layers in each switch.

9. The method of claim 8, further comprising:
calculating a diode junction temperature for the bonding wire in the corresponding switch based at least in part on the power loss of each diode;
generating a second accumulated fatigue damage of the bonding wire in each switch based on the corresponding diode junction temperature;
generating the estimated remaining lifetime of the switching amplifier based on at least one of the first accumulated fatigue damages of the bonding wires in each switch, the second accumulated fatigue damages of the bonding wires in each switch, and the accumulated fatigue damages of the solder layers in each switch.

10. The method of claim 9, further comprising:
generating the first accumulated fatigue damage of the bonding wire in each switch based on peak values and valley values of the switch junction temperature;
generating the second accumulated fatigue damage of the bonding wire in each switch based on peak values and valley values of the corresponding diode junction temperature; and
generating the accumulated damage of the solder layer in each switch based on peak values and valley values of the case temperature.

11. A gradient amplifier, comprising:
a power device comprising a plurality of bridge circuits coupled in series between two terminals of a gradient coil and each comprised of a plurality of switches; and
a processing device configured to:
calculate a switch junction temperature for a bonding wire in each of the plurality of switches based at least in part on a power loss of each switch;
generate a first accumulated fatigue damage of the bonding wire in each switch based on the switch junction temperature; and
generate an estimated remaining lifetime of the switching amplifier based on the first accumulated fatigue damages of the bonding wires in each switch.

12. The gradient amplifier of claim 11, wherein each of the plurality of switches is coupled in parallel with a diode, the processing device is further configured to:
calculate a diode junction temperature for the bonding wire in the corresponding switch based at least in part on the power loss of each diode;
generate a second accumulated fatigue damage of the bonding wire in each switch based on the corresponding diode junction temperature;
calculate a case temperature for a solder layer in each switch based on an average value of the power loss of each switch and a power loss of the corresponding diode;
generate an accumulated fatigue damage of the solder layer in each switch based on the case temperature; and
generate the estimated remaining lifetime of the switching amplifier based on at least one of the first accumulated fatigue damages of the bonding wires in each switch, the second accumulated fatigue damages of the bonding wires in each switch, and the accumulated fatigue damages of the solder layers in each switch.

* * * * *